United States Patent [19]

Turlot et al.

[11] Patent Number: 5,789,851
[45] Date of Patent: Aug. 4, 1998

[54] FIELD EMISSION DEVICE

[75] Inventors: Emmanuel Turlot, Balzers, Liechtenstein; Jacques Schmitt, La Ville du Bois; Thierry Emeraud, Bures sur Yvette, both of France

[73] Assignee: Balzers Aktiengesellschaft, Furstentum, Liechtenstein

[21] Appl. No.: 573,257

[22] Filed: Dec. 15, 1995

[51] Int. Cl.$^6$ ...................................................... H01T 1/30
[52] U.S. Cl. ........................... 313/336; 313/309; 313/351
[58] Field of Search ...................................... 252/502, 512; 148/33; 313/336, 351, 309, 310

[56] References Cited

U.S. PATENT DOCUMENTS

| | | | |
|---|---|---|---|
| 4,377,628 | 3/1983 | Ishioka et al. | 252/501.1 X |
| 4,798,739 | 1/1989 | Schmitt | 427/38 |
| 4,989,543 | 2/1991 | Schmitt | 118/723 |
| 5,515,986 | 5/1996 | Turlot et al. | 216/71 |
| 5,585,301 | 12/1996 | Lee et al. | 313/306 X |

*Primary Examiner*—Nimeshkumar Patel
*Attorney, Agent, or Firm*—Notaro & Michalos P.C.

[57] ABSTRACT

A field emission device has a basic substrate whose surface is coated with a conductive layer that forms an electrode. A field emission emitter which is formed as a micro-tip, is electrically connected to the electrode. Between the micro-tip and the electrode, a current limiting resistive silicon film is arranged and the resistivity of the silicon film is adjusted to be in a value ranging from about $10^2$ to about $10^5 \Omega cm$ by an n- or p-dopant. The silicon film contains an alloying element which would be able to form a silicon ceramic if used in a stoichiometric amount but would not be able to dope the silicon.

9 Claims, No Drawings

FIELD EMISSION DEVICE

FIELD AND BACKGROUND OF THE INVENTION

The present invention relates generally to electronic devices with a semi-resistive layer and more particularly to field emission devices.

Some electronic devices, and especially field emission devices, need a resistive layer in their structure. Such a resistive layer has to be adapted especially carefully in the application of field emission display panels due to the need for the mass production of field emission micro-tips and the safe reproduction of the function of such flat panel displays. The purpose of such a layer is to create a current limiting resistance in the field emissive circuit of each pixel of the display matrix. This resistance acts as a limiting resistor, like a buffer to inhibit an onset of undesirable vacuum arcs which would destroy pixels or create short circuits. The typical required resistivity range is $10^2$ to $10^5$ Ohm centimeter. That resistivity is out of reach for classical resistor films, such as metal alloys or cermets. N- or P- doped semiconductors have been adapted as described in IEEE Transactions on Electron Devices, Vol. 38, no. 10, October 1991 "Sealed vacuum devices, fluorescent micro-tip displays", A. Ghis et al. Phosphorous doped silicon was the favored choice for making the resistance layer. To deposit that layer, it is known to use a PVD process like sputtering. A technical problem in manufacturing such an electronic device with a resistive layer, and especially of manufacturing a field emission device with a resistive layer, is that at least one process step is needed, during which the temperature reaches about 450° C. This occurs when the glass vacuum cell of the flat panel is sealed. This step takes place at the end of the manufacturing sequence. During this annealing step, the nature of the silicon film changes. Since the sputtered film is initially amorphous it tends to recrystallize. The annealing temperature is exactly the critical temperature for crystallization, hence depending on the exact value and/or the details of the temperature ramp up, plateau, and ramp down, the crystallization will be more or less advanced. Unfortunately in parallel with crystallization the material conductivity can vary very rapidly. This variation can be of several orders of magnitude and can go up or down depending on the dopant concentration and possibly the nature and the concentration of other impurities that can be present in the initial film. As a result the final resistivity of the resistive layer is difficult to predefine and due to recrystallization it is difficult to keep the production conditions stable. Therefore it is an object of the present invention to find a composition for a resistive layer material which is easy to process and which is very stable in its resistive behavior during the entire manufacturing procedure.

SUMMARY OF THE INVENTION

This requirement and others are substantially met through provision of an electronic device including a semi-resistive layer whereby the resistivity of that layer remains stable after temperature cycling up to 500° C. The semi-resistive layer consists of an N- or P-doped silicon film deposited preferably by a PECVD process and where the resistivity is adjusted preferably to a value ranging from $10^2$ to $10^5$ Ohm centimeter. For stabilizing that resistivity, the silicon film contains an alloying element which could form a silicon ceramic if it is used in a stoichiometric amount, but this alloying element would not be able to dope the silicon. A preferred application of such a resistive layer is for use in a field emission device. Such field emission devices are used in large numbers in field emission displays in a flat panel arrangement. In that application, a basic substrate is coated on its surface with a conductive layer which forms an electrode and on that electrode, field emission emitters are placed which are formed as micro-tips and which are electrically connected to that electrode. Between the micro-tip and the electrode, such a current limiting resistive silicon film is arranged so that this resistive film limits the current to a desired level and thus no unwanted discharge can occur.

The various features of novelty which characterize the invention are pointed out with particularity in the claims annexed to and forming a part of this disclosure. For a better understanding of the invention, its operating advantages and specific objects attained by its uses, reference is made to the following descriptive matter in which a preferred embodiment of the invention is illustrated.

DETAILED DESCRIPTION OF THE PREFERRED EMBODIMENTS

Semiresistive layers are difficult to make. Resistive layers for electronic devices, and especially for field emission devices for flat panel displays, are preferably made of a-Si which is low or medium doped to adjust the required conductivity to be in the range $10^2$ to $10^5$ Ohm centimeter. A method for fabricating thin doped silicon films is, for instance, PVD processes, such as sputtering or PECVD processes. It is not easy to adjust the gas levels for the desired fine doping of the silicon film during such processes. That is why the PECVD process is preferred for that application because the gas levels are better adjustable. Especially preferred for fabricating such thin film resistive layers are PECVD methods and arrangements as described in the U.S. Pat. Nos. 4,989,543 and 4,798,739 and U.S. patent application Nos. 08/237,575 and 08/237,432 which are incorporated here by reference, and form and integral part of this application. In the described arrangements, the possible flow of doping gas is significantly larger—about an order of magnitude for the same conductivity as in the known prior art arrangements. Hence, this flow is much easier to control for the desired fine doping level.

With the PECVD system it is also easier to feed in the alloying element in a gaseous form. This alloying element can preferably be a nitrogen, oxygen or carbon containing gas. It is also possible to use such gases in combination as a mixture. Especially good results have been achieved with a carbon containing gas, for instance preferably with $CH_4$. To reach thermal stability up to 500° C. in this silicon-resistive layer, it is a need to alloy that silicon with 2%–50% nitrogen or 2%–50% oxygen or 2%–90% carbon. Especially good results are obtained with the content in relation to silicon of 2%–20% nitrogen or 2%–20% oxygen or 2%–80% carbon, whereby for carbon, even better results are obtained with a content of 5%–10%. For the application of the field emission device, to reach the wanted effect with an economical fabrication process, it is an advantage to deposit doped amorphous silicon, such as a-Si:H. An example of a preferred fabrication procedure of the resistive film with a PECVD process is now described:

The PECVD process was realized in a production system as described in the above mentioned patents and patent applications. As an example, a resistive film was created by a-SiC:H doped with phosphorous. A plasma was ignited and maintained with the gases $SiH_4$, $CH_4$, $Ph_3$, mixed in the proportion 1:1:0.01 at a temperature above 250° C. on the substrate surface. The substrate, heated at the above temperature, was placed in direct contact with the plasma so that it was coated with the desired resistive film. The plasma can be ignited and maintained with any power sources common for plasma processes, but here, RF at 13.6 MHz was used because this is an industrial standard. The total pressure of the gases can be in the range of 0.1 to 10 mbar, preferred 0.1–1.0 mbar, but here 0.5 mbar was preferred. The resistivity was adjusted with the proportion of $Ph_3$, but also depends on the $CH_4$ proportion. In the example here, a conductivity in the range of $10^{-4}$ to $10^{-3}$ $Ohm^{-1}$ $centimeter^{-1}$ was obtained. The thickness which was deposited depends also on the resistivity which is desired. The relevant parameter for the resistive film for field emitting tips, is the resistance of the film per unit area which is the product of the resistivity by the film thickness. The resistive film was deposited on a substrate plate with a dimension of 37 by 47 cm² with a uniformity of better than ±7%. The deposition rate was ≈3.5 A/s whereby the thickness of the whole film was ≈0.4 nm. The film's initial tensile stress reached about 60 MPa. The stability of the resistance after a temperature annealing at 450° C. for an hour was very good. Before the annealing step the resistivity was $8·10^4$ $\Omega$centimeter and after the annealing it was $5·10^4$ $\Omega$centimeter. This very small variation can be neglected in relation to the big variation in some magnitude of orders which was commonly reached by the prior art methods. Thus, this doped amorphous silicon layer alloyed with carbon allows fabrication of a very stable and reproducible working field emission flat panel display, with an economical process.

For the purpose of this disclosure, the alloying element is such an element which, if used in stoichiometric amount, would produce a silicon ceramic.

This would be a superimposed selection criterion for an alloying element, however. In contrast, in the present invention the alloying element must not be used in a stoichiometric ratio, that is, it is not used in the ratio that would from a silicon ceramic.

While a specific embodiment of the invention has been shown and described in detail to illustrate the application of the principles of the invention, it will be understood that the invention may be embodied otherwise without departing from such principles.

What is claimed is:

1. A field emission device comprising:
   a basic substrate whose surface is coated with a conductive layer which forms an electrode;
   a field emission emitter which is formed as a micro-tip electrically connected to the electrode; and
   a current limiting resistive amorphous silicon film between the micro-tip and the electrode, the resistivity of the amorphous silicon film being set to be in a value ranging from about $10^2$ to about $10^5 \Omega$cm by an n- or p-dopant and the amorphous silicon film containing an alloying element which would be able to form a silicon ceramic if used in a stoichiometric amount but would not be able to dope the amorphous silicon, the resistivity of the amorphous silicon film remaining stable after exposure to temperature cycling up to 500° C.

2. A field emission device as set forth in claim 1, wherein said alloying element consists essentially of N, O or C, or a combination thereof.

3. A field emission device as set forth in claim 1, wherein said alloying element consists essentially of C.

4. A field emission device as set forth in claim 2, wherein said alloying element is in a portion in relation to the silicon, of 2% to 50% for N, and 2% to 50% for O and 2% to 90% for C.

5. A field emission device as set forth in claim 4, wherein said alloying element is in a portion in relation to the silicon, of 2% to 20% for N, 2% to 20% for O, and 2% to 80% for C.

6. A field emission device as set forth in claim 3, wherein said alloying element is in a portion in relation to the silicon, of 5% to 10% for C.

7. A field emission device as set forth in claim 4, wherein the silicon is essentially doped a-Si:H.

8. A field emission device as set forth in claim 1, wherein the field emission device is an electron emitter of a Field Emission Display.

9. A field emission device as set forth in claim 4, wherein the field emission device is an electron emitter of a Field Emission Display.

* * * * *